United States Patent [19]
Zulian

[11] Patent Number: 5,903,914
[45] Date of Patent: May 11, 1999

[54] MEMORY ACCESS LIMITER FOR RANDOM ACCESS DYNAMIC MEMORIES

[75] Inventor: Ferruccio Zulian, Cornaredo-Milan, Italy

[73] Assignee: Bull HN Information Systems Italia S.P.A., Torino, Italy

[21] Appl. No.: 08/757,404

[22] Filed: Nov. 27, 1996

[30] Foreign Application Priority Data

Nov. 28, 1995 [EP] European Pat. Off. .............. 95830495

[51] Int. Cl.$^6$ ....................................................... G06F 12/14
[52] U.S. Cl. ............................... 711/163; 711/5; 711/104; 395/750.02; 395/750.08; 365/226; 365/227; 365/228; 365/195
[58] Field of Search .......................... 395/750.02, 750.08; 365/226, 227, 228, 195, 236; 711/5, 104, 163

[56] References Cited

U.S. PATENT DOCUMENTS

| | | | |
|---|---|---|---|
| 4,700,330 | 10/1987 | Altman et al. ........................... | 365/222 |
| 5,148,546 | 9/1992 | Blodgett .............................. | 395/750.03 |
| 5,168,206 | 12/1992 | Jones . | |
| 5,182,810 | 1/1993 | Barting et al. ..................... | 395/750.05 |
| 5,404,543 | 4/1995 | Faucher et al. . | |
| 5,765,219 | 6/1998 | Densham et al. ....................... | 711/220 |

FOREIGN PATENT DOCUMENTS 0 675 425 A2  10/1995  European Pat. Off. .
0 675 425 A3  10/1995  European Pat. Off. .

Primary Examiner—Tod R. Swann
Assistant Examiner—Mehdi Namazi
Attorney, Agent, or Firm—Finnegan, Henderson, Farabow, Garrett & Dunner, L.L.P.

[57] ABSTRACT

A memory access limiter for random access dynamic memory of data processing systems formed by several modules which can be independently activated in partial temporal superimposition, each by a memory start command, comprising a bidirectional counter which periodically increments at a constant period defined by a clock signal, by a value representative of the electrical charge delivered by a power supply to an output buffer capacitor and decrements, at each memory start command, by a value representative of the electrical charge drained at each memory operation activated by the memory start command, a predetermined decremented count state of the counter identifying a maximum admissible discharge condition of the buffer capacitor below which it is necessary to inhibit any further activation of the memory until the count state of the counter is no longer below the predetermined count state.

12 Claims, 2 Drawing Sheets

MEMORY ACCESS LIMITER FOR RANDOM ACCESS DYNAMIC MEMORIES

FIELD OF THE INVENTION

The present invention relates a memory access limiter for random access dynamic memories of data processing systems.

BACKGROUND

It is known that in modern data processing systems high capacity random access dynamic memories are widely used, having a high capacity of the order of tens and even hundreds of MegaBytes.

These memories are generally structured in modular banks, or simply modules, individually accessible in such a way as to be able to operate in temporal overlap with one another and generally to achieve a data processing capacity (throughput) adequate for the requirements of modern data processing systems, in particular multiprocessor systems which are intrinsically faster than the memories.

With particular memory module interleaving techniques it is possible to arrange that whilst a memory module performs an information reading or writing operation, controlled by a processor, the same processor or other processors can control and start other reading or writing operations in different modules, on the sole condition that the information to be read or written is resident or must be written in different modules from those already activated.

Therefore the joint or simultaneous use of several memory modules does not obey systematic criteria which can be determined a priori, but is variable in time in a probabilistic manner depending on the type of processes performed by the different processors and memory location of the data necessary for the performance of the different processes.

In practice, in order to achieve optimum performance of the data processing system, the number of memory modules is chosen in relation to the number and speed of the processors and to the speed of the memory, in such a way that the memory access times are minimised or nil.

Consequently on average only about 50% of the memory modules are contemporaneously active, and only exceptionally are all the memory modules contemporaneously active, but this possibility cannot be excluded nor its duration can be forecast.

This fact has serious implications for the power supply of data processing systems and associated processors and memory modules which, as is known, must be supplied from a regulated voltage power supply able to satisfy all the possible load conditions.

In fact, whilst processors have a relatively constant current consumption the memory modules, when inactive, have a negligible consumption whilst when active the current consumption is high and of the same order as that of the processors.

Thus, by way of indication, if a power supply is dimensioned to deliver the maximum instantaneous current required by a data processing system the current delivered when the memory is inactive can be of the order of 20% and reaches 100% only when all the memory modules are contemporaneously active, whilst normally it is of the order of 60%.

The power supply is therefore exploited far below its effective potential.

Power supplies constitute a not insignificant factor in terms of cost and size of data processing systems and it is therefore desirable to dimension them as a function of the normal load requirements, to allow an optimum use to be made of them, whilst containing possible exceptional overload conditions and their duration within predetermined limits such as not to prejudice the operation of the power supply.

SUMMARY OF THE INVENTION

This requirement is satisfied by the memory access limiter which forms the subject of the present invention.

Power supplies for data processing systems are provided with a filtering and output buffer capacitor able to support temporary overloads within certain limits. This capacitor is charged in normal working conditions to a level corresponding to a predetermined output voltage by the current, and therefore by the electric charge Q provided in time by the power supply and is discharged by the current delivered to the load, therefore by the electric charge drained by the load.

When the electric charge drained by the load in a time interval is greater than the electric charge provided in the same time by the power supply the capacitor partially discharges and the voltage across the capacitor, and consequently the output voltage of the power supply, decreases.

In order to ensure correct operation of the processing system it is necessary to ensure that the negative voltage variation is in absolute value less than a predetermined amount.

The memory access limiter in accordance with the present invention is essentially constituted by a bidirectional counter the state of which is indicative of the charge condition of the capacitor.

The counter increments periodically, with a constant period, by a first predetermined amount, preferably a multiple of the count unit, representative of the electric charge delivered by the power supply during the course of the time period, up to a maximum count condition indicative of a charge state corresponding to a nominal working voltage of the power supply, and decrements upon each activation of a memory module by a second predetermined amount corresponding to the electric charge drained by the execution of the memory read/write operation.

If the cumulative decrements over time are only partially compensated by the periodic increments, and the counter thereby attains a count state equal to or less than a predetermined value (corresponding to a maximum admissable voltage drop at the output of the power supply) each further memory access is inhibited until the count state of the counter returns to a value greater than the predetermined value.

BRIEF DESCRIPTION OF THE DRAWINGS

The characteristics and advantages of the present invention will become clearer from the following description of a preferred embodiment and the attached drawings, in which.

DETAILED DESCRIPTION

Figure 1:
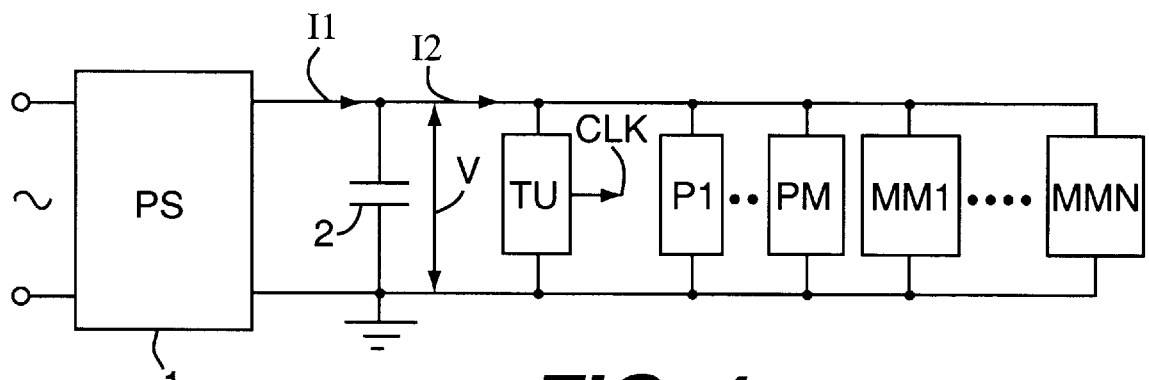
FIG. 1 is a block schematic diagram of the structure of a multiprocessor data processing system considered as the load of a power supply.

With reference to FIG. 1, a data processing system generally comprises a power supply 1, supplied with the mains voltage, which produces at its output, on a buffer capacitor 2, a regulated voltage V, in general +5 V, which supplies a plurality of processors P1, . . . PM and a plurality of memory modules MM1, MMN, as well as a timing unit TU the output signal from which is a periodic clock signal CLK.

In synchronised systems the signal CLK times the operations of all the processors and memory modules.

In asynchronous systems, different timing units time each of the processors and the various memory modules.

The power supply regulates the output voltage by varying the current I1 delivered to the capacitor 2 in such a way that the charge voltage V remains unvaried.

Therefore for a short time the average current I1 is equalised with the variable current I2 consumed by the load.

However the regulation capacity of the power supply is not unlimited and there exists a current limit I1MAX which cannot be exceeded and which is imposed by protection circuits. Therefore if the current I2 consumed by the load is greater than I1MAX the capacitor 2 discharges partially and the voltage V decreases until protective intervention is triggered which blocks the operation of the system.

Evidently the following relation is valid:

(1) $c*\Delta v = \Delta Q$ where C is the capacity of the capacitor 2
$\Delta V$ is the voltage variation and
$\Delta Q$ is the variation of the electric charge accumulated on the capacitor.

If $\Delta VMAX$ is the maximum admissible voltage variation which does not prejudice the operation of the system and does not cause the intervention of the protection systems, $\Delta QMAX = C*\Delta VMAX$ represents the maximum admissible variation of the charge on the capacitor 2.

For example, if the capacity C is equal to 10,000 $\mu F$ and $\Delta VMAX = 0.1$ V, $\Delta QMAX = 10,000 * 10^{-3} * 0.1 = 10^{-3}$ coulombs.

The relation (1) makes it possible to establish the maximum duration of a possible overload due to the contemporaneous activation of several memory modules.

In fact $\Delta Q = (I2-I1MAX)*t$
therefore $t = \Delta Q/(I2-I1MAX)$

For example if the power supply is designed to deliver a maximum current of 18A (over and above the current necessary to supply the constant load of the processors and the auxiliary circuits such as the timing unit) and if each memory module, when activated, drains 6A, three memory modules can be active simultaneously and continuously but six memory modules can be active contemporaneously only for a time interval $$t = \Delta Q/(36-18) = 10^{-3}/18 = 555 \ \mu s.$$

Five memory modules can be contemporaneously active only for a time interval $$t = \Delta Q/(30-18) = 10^{-3}/12 = 833 \ \mu s.$$

Four memory modules can be contemporaneously active only for the time interval $$t = \Delta Q/(24-16) = 10^{-3}/6 = 1.666 \ s.$$

If during the course of this time interval the number of contemporaneously active modules changes, this also correspondingly changes the duration of the time interval beyond which it is necessary to limit the activation of the memory modules in such a way that the overload condition ceases.

A further element of variability derives from the fact that an overload condition can occur if the buffer capacitor, partially discharged by a preceding overload condition, has not yet recovered the necessary charge to return it to the nominal charge voltage V and is therefore lower than this value.

It is therefore not possible to use limiter devices based merely on a recognition of the existence of an overload and its duration, but rather it is necessary to intervene on the basis of the preceding history and on the different power supply conditions.

Figure 2:
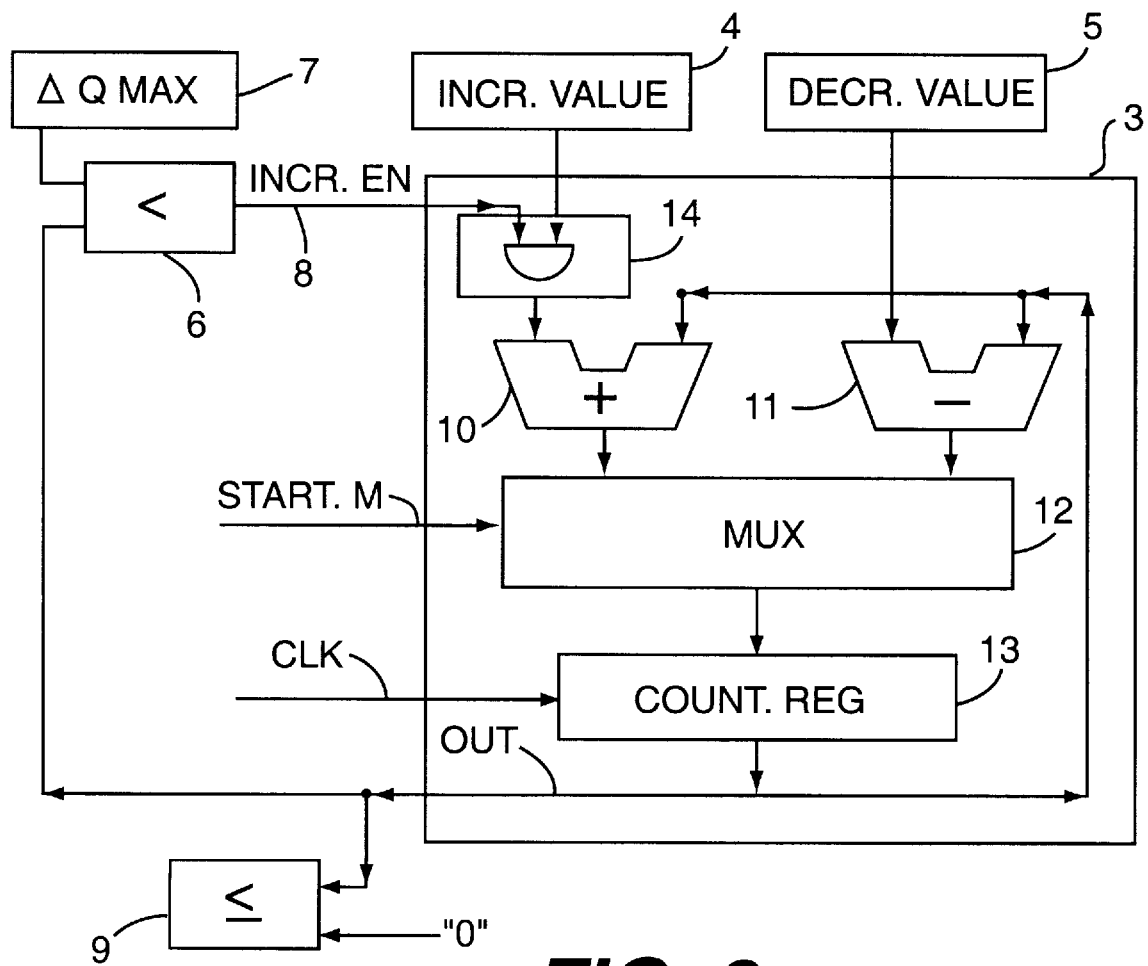
FIG. 2 is a block schematic diagram of a preferred embodiment of memory access limiter in accordance with the present invention.

FIG. 2 is an electric block diagram of a preferred embodiment of the memory access limiter according to the present invention.

The limiter essentially comprises a bidirectional incrementing/decrementing counter 3 which receives at its input, preferably, but not necessarily, from a first register 4, a first binary code representative of a predetermined increment value (INCR.VALUE) and from a second register 5, a second binary code representative of a predetermined decrement value (DECR.VALUE).

The increment value INCR.VALUE represents the electric charge provided by the power supply to the capacitor 2 in an arbitrary unit of time conveniently chosen to be equal to the period P of a clock signal CLK of the data processing system.

The decrement value (DECR.VALUE) represents, on the same scale as INCR.VALUE the electric charge consumed by an activated memory module in performing a read/write cycle.

In general the duration of a read/write cycle is a multiple of the period P of the clock signal CLK (for example 9 times).

For practical reasons which will become clearer hereinafter the value DECR.VALUE can represent the electrical charge consumed by an activated memory module less the electrical charge defined by the value INCR.VALUE (or a multiple of this).

The counter 3 receives the signal CLK at its input as an increment command and the signal START.M asserted by activation of any of the memory modules as a decrement command identified by a module selection signal which is of no concern here.

The output OUT of the counter 3 is applied to an input of a comparator 6 which receives at a second input, from a register 7, a code representative of the maximum admissible charge variation $\Delta QMAX$, of the power supply capacitor.

When the count state at the output of the counter is less than the value $\Delta QMAX$ the comparator 6 sends a signal INCR.EN to the counter 3 along a wire 8, which enables incrementation of the counter.

Otherwise incrementation is inhibited.

The output OUT of the counter is likewise connected to one input of a second comparator 9 which receives at a second input a suitable comparison code, for example all zeros.

When the output count state of the counter 3 is equal to or less than zero the comparator 3 asserts at its output a signal INHB which is used to inhibit any further memory access operation and therefore activation of any memory module. (Examples of possible ways in which the signal INHB may be used will be provided below).

It is therefore evident that the state of the counter 3 evolves over time and describes the charge state of the power supply capacitor and its variations.

If the electrical charge delivered by the power supply exceeds that consumed by the load the counter reaches and maintains the maximum count state, corresponding to the capacitor being charged to the nominal voltage, defined by the comparator 6.

In the case of an overload the decrementing operations of the counter prevail over the incrementing operations and at the output OUT of the counter there is present a count state gradually less than the maximum and corresponding to the reduction in the electrical charge accumulated in the power supply capacitor.

When this reduction exceeds the maximum admissible variation any further memory access can be inhibited by the signal INHB at the output from the comparator 9 until the count state of the counter guarantees that the minimum admissible charge state of the power supply capacitor has been reestablished.

FIG. 2 represents in detail a preferred embodiment of the counter 3 which can be controlled by a high frequency clock signal, for example 50–100 MHZ, now common in most modern data processing systems.

The counter 3 comprises a summing network 10, a subtracting network 11, a multiplexer 12, a state count register (LATCH) 13 and a group of AND gates 14.

The summing network has a first input connected through the AND gates 14 to the output of the register 4 to receive the code INCR.VALUE, and a second input connected to the output of the count register 13.

The group of AND gates 14 is enabled to transfer the code INCR.VALUE to its output when the signal INCR.EN is asserted.

Otherwise the code applied to the input of the summing network is an "all zeros" code.

The subtracting network 11 has a first input connected to the output of the register 5 to receive the code DECR-.VALUE and a second input connected to the output of the count register 13.

In this way the two networks can operate in temporal superimposition.

The outputs of the summing network 10 and the subtracting network 11 are applied to the inputs of the multiplexer 12 controlled by the signal START.M to apply the output of the summing network 10 or the output of the subtracting network 11 selectively to the input of the register 13.

The information at the output from the multiplexer 12 is loaded into the register 13, under the control of the clock signal CLK, for example controlled by the rising edge of the clock pulses.

Figure 3:
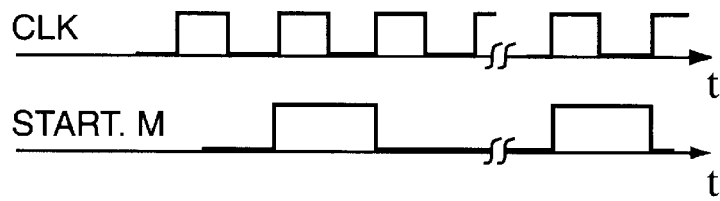
FIG. 3 is a timing diagram showing exemplary control signals for the limiter of FIG. 2.

As shown in the timing diagram of FIG. 3 the signal START.M for activation of the memory modules is conveniently asserted in suitable phase relation with the clock signal, for example in synchronism with the signal CLK or with a suitable delay with respect to this, and has a convenient duration, for example equal to the period P.

This avoids the possibility that commutation of the multiplexer at the instant in which the output information is transferred to the register 13 gives rise to uncertainty conditions.

The rising edge of the signal CLK contained in the assertion interval of the signal START.M or as illustrated, synchronised with the de-assertion of the signal START.M then determines with certainty the decrementing of the contents of the register 13.

Since the content of the register 13 cannot be simultaneously incremented and decremented, as already mentioned, the decrementation value DECR.VALUE is conveniently set to correspond to the electrical charge drained by one memory module activation operation less the electrical charge provided by the power supply in the course of one period of the clock signal CLK.

If the duration of the signal START.M is a multiple of the clock period it is evident that the value expressed by DECR.VALUE must be corrected as a consequence.

It is clear that FIG. 2 represents only one embodiment, preferred because of its flexibility and adaptability to different requirements including the use of power supplies with different electrical characteristics such as power and output capacity, or the use of memory modules with different current consumption.

In dependence on circumstances different values can be loaded into the different registers 4, 5 and 7.

If this flexibility is not essential nothing prevents the registers 4, 5 and 7 from being replaced by any other means for generating electrical signals representative of binary codes, such as, for example, connection of the inputs of counter 3 to voltages representative of one of two logic levels.

It is likewise clear that in this case the comparator 6 can be replaced by a decoder as, in general, can the comparator 9.

The internal structure of the counter 3 is also susceptible of wide modifications and, for example, the two separate summing and subtracting networks can be replaced by a single arithmetic logic network controlled by the signal START.M and possibly by the signal CK to perform the summing or subtraction operation in dependence on the logic level of the control signals.

It is also evident that the bidirectional counter can be controlled for decrementing operations rather than incrementing operations by each received pulse of the periodic clock signal CLK and to increment at each received pulse of the signal START.M.

Figure 4:
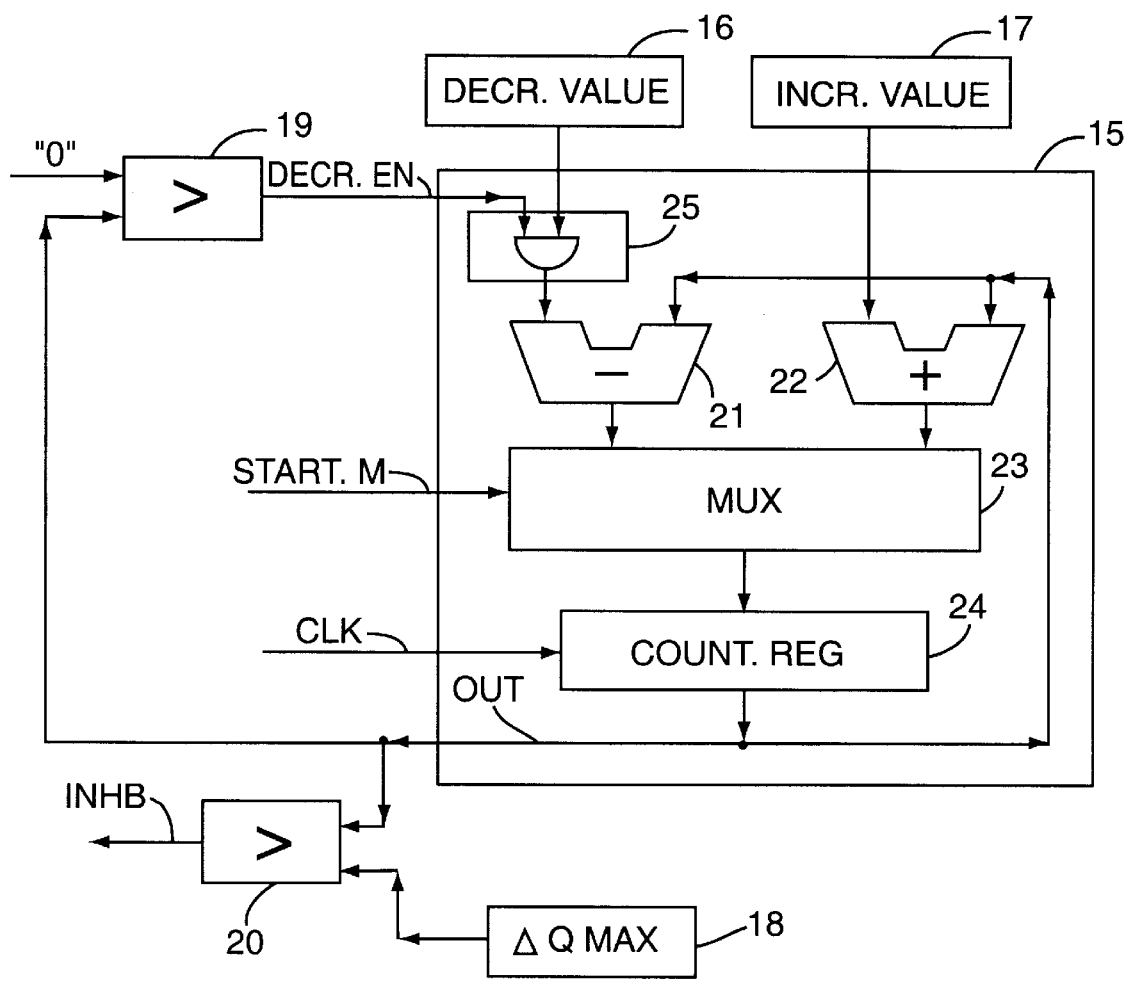
FIG. 4 is a block schematic diagram of a second embodiment of memory access limiter according to the present invention.

In this case, as shown in FIG. 4, the structure of the access limiter is entirely similar to that of FIG. 2 and again includes a counter 15, a state register 16 for the decrement value DECR.VALUE (corresponding to the electrical load provided by the power supply in one period of the clock signal CK), a state register 17 for the increment value INCR-.VALUE (corresponding to the charge consumed at each read/write operation activated by the command START.M), a state register 18 for a value ΔQMAX representative of the maximum admissible charge variation of the power supply buffer capacitor and two comparators 19, 20 respectively for recognising count states of the counter 15 greater than a minimum count state (for example 0) and a maximum count state ΔQMAX).

As in FIG. 2 the counter is formed by a subtracter 21, an adder 22, a multiplexer 23, a count state register 24 (COUNT.REG) and a group of AND gates 25. The output of the register 24 is connected both to one input of the subtracter 21 and to one input of the adder 22 which receive at respective second inputs the codes DECR.VALUE (via the group of AND gates 25) and INCR.VALUE.

The outputs of the adder and subtracter are connected to the inputs of the multiplexer 23 controlled by the asserted signal START.M to transfer the code INCR.VALUE to its output.

The output of the multiplexer 23 is connected to the input of the register 24 controlled by the signal CLK.

The output of the register 24 is connected to one input of the comparator 19 the output of which enables the group of gates 25 if the count state stored in the register 24 is greater than a predetermined value. The output of the register 24 is likewise connected to one input of the comparator 20, which receives at a second input (from the register 18) the code ΔQMAX and asserts at its output a signal INHB if the count state of the counter exceeds the value ΔQMAX.

In this case the registers 16, 17, 18 can also be replaced by other means for generating codes and the comparators can be replaced by decoders.

Although outside the scope of the invention it is suitable, for completeness of description, to indicate how in practice the signal INHB can be used to limit memory access.

In the case of single processor systems with several independently activatable memory modules, even if provided with prefetching devices with consecutive activation of several modules, the problem of power supply overload occurs in general only when write operations are commanded in rapid succession.

Communication between processor and memory takes place via a system bus and via the intermediary of a memory control unit in conformity with a predetermined communication protocol.

Different communication protocols are used; all however are characterised by a memory-access request phase in which the processor puts on the system bus a read/write command and a memory address, and by a response phase in which the memory control unit confirms, with a signal, that the requested operation has been performed or will be performed.

The processor cannot present other access or memory requests to the system bus until the confirmation signal has been received from the memory control unit.

It is therefore evident that in this case the signal INHB received from the memory control unit can inhibit the assertion of the confirm signal by the memory control unit, in fact blocking dialogue between the processor and the memory control unit for the whole of the time required.

In the case of multiprocessor systems communication between the various processors and the memory control unit also take place via a system bus in conformity with a communication protocol which comprises, as well as the two phases already mentioned, a preliminary arbitration phase for determining access to the system bus.

Before obtaining effective access to the system bus the different processors must present an access-request to the system bus, and an arbitration logic, which can be an integral part of the memory control unit, an autonomous unit or even distributed logic between the various processors, settles the access conflict to the system bus by assigning access to the system bus to only one of the different competing processors at a time on the basis of predetermined priority criteria.

In this case the signal INHB can be utilised both to block the communication protocol dialogue between the individual processors and the memory control unit and to block the arbitration phase for the whole of the time required.

I claim:

1. A memory access limiter for random access dynamic memory of a data processing system formed by several independently activatable modules which can be independently activated in at least partial temporal superimposition by a memory start command, a timing unit providing a periodic timing signal with a constant period to said data processing system, said memory being supplied by a power supply having an output buffer capacitor and a maximum deliverable current less than the peak current consumed by said memory, said access limiter comprising:

first means for providing a first coded value representative of the charge increment delivered by said power supply to said buffer capacitor during one period of said clock signal, second means for providing a second coded value representative of the quantity of electrical charge drained by one of said modules in one read/write cycle activated by said memory start command, a counter connected to said first and second means to receive said first and second coded value, said counter incrementing by said first value on command of said timing signal and decrementing by said second value on command of said memory start command, third means for enabling incrementation of said counter only for a count state of said counter less than a first predetermined count value, and fourth means for recognising a count state of said counter less than a second predetermined count value and generating a corresponding memory access inhibition signal as long as said count state of said counter is less than said second predetermined count value.

2. A memory access limiter as in claim 1, in which said first means comprises a first memory register for storing said first coded value and said second means comprises a second memory register for storing said second coded value.

3. A memory access limiter as in claim 2, in which said third means for enabling incrementation of said counter only for a count state of said counter less than a first count value comprises a third register for storing said first count value and a comparator connected to said third register and to said counter to compare the count state of said counter with said first count value stored in said third register.

4. A memory access limiter as in claim 3, in which said counter includes a fourth state register for said count state controlled by said periodic timing signal, a summing network receiving at its input said count state from said fourth register and said first coded value from said first means, a subtracting network receiving at its input said count state from said fourth register and said second coded value from said second means, and a multiplexer controlled by said memory start command to apply the output of said summing network to the input of said fourth register if said memory start command is deasserted and the output of said subtracting network if said memory start command is asserted.

5. A memory access limiter as in claim 3, in which said fourth means includes a comparator connected to said counter to compare the count state of said counter with said second count value.

6. A memory access limiter as in claim 5, in which said counter includes a fourth state resister for said count state controlled by said periodic timing signal, a summing network receiving at its input said count state from said fourth register and said first coded value from said first means, a subtracting network receiving at its input said count state from said fourth register and said second coded value from said second means, and a multiplexer controlled by said memory start command to apply the output of said summing network to the input of said fourth register if said memory start command is deasserted and the output of said subtracting network if said memory start command is asserted.

7. A memory access limiter for random access dynamic memory of data processing systems formed by several modules which can be activated independently in at least partial temporary superimposition by a memory start command, a timing unit providing a periodic timing signal with a constant period to said data processing system, said memory being supplied by a power supply having an output buffer capacitor and a maximum deliverable current less than the peak current consumed by said memory, said access limiter comprising:

first means for providing a first coded value representative of the charge increment delivered by said power supply to said buffer capacitor during one period of said clock signal, second means for providing a second coded value representative of the quantity of electrical charge drained by one of said modules in a read/write cycle activated by the said memory start command, a counter connected to said first and second means to receive said first and second coded value, said counter decrementing by said first value on command of said timing signal and incrementing by said second value on command of said memory start command, third means for enabling said counter to decrement only for a count state of said counter greater than a first predetermined count value, fourth means for recognising a count state of said counter greater than a second predetermined count value and generating a corresponding memory access inhibition signal as long as said count state of the said counter is greater than said second predetermined count value.

8. A memory access limiter as in claim 6, in which said first means comprises a first register for storing said first coded value and said second means comprises a second register for storing said second coded value.

9. A memory access limiter as in claim 8, in which said third means for enabling said counter to decrement only for a count state of said counter greater than a first count value comprises a comparator connected to said counter to compare the count state of said counter with the said first count value.

10. A memory access limiter as in claim 9, in which said counter includes a fourth state register for said count state commanded by said periodic timing signal, a summing network receiving at its input said count state from said fourth register and said second coded value from said second means, a subtracting network receiving at its input said count state from said fourth register and said first coded value from said first means, and a multiplexer controlled by said memory start command to apply to the input of said fourth register the output of said summing network if said memory start command is asserted and the output of said subtracting network if said memory start command is deasserted.

11. A memory access limiter as in claim 9, in which said fourth means comprises a comparator, a third register for storing said second count value, said comparator being connected to said counter and to said third register to compare the count state of said counter with said second count value.

12. A memory access limiter as in claim 11, in which said counter includes a fourth state register for said count state commanded by said periodic timing signal, a summing network receiving at its input said count state from said fourth register and said second coded value from said second means, a subtracting network receiving at its input said count state from said fourth register and said first coded value from said first means, and a multiplexer controlled by said memory start command to apply to the input of said fourth register the output of said summing network if said memory start command is asserted and the output of said subtracting network if said memory start command is deasserted.

\* \* \* \* \*